United States Patent
Lin et al.

(10) Patent No.: US 11,557,717 B2
(45) Date of Patent: Jan. 17, 2023

(54) TRANSITION METAL DICHALCOGENIDE BASED SPIN ORBIT TORQUE MEMORY DEVICE WITH MAGNETIC INSULATOR

(71) Applicant: Intel Corporation, Santa Clara, CA (US)

(72) Inventors: Chia-Ching Lin, Portland, OR (US); Tanay Gosavi, Hillsboro, OR (US); Sasikanth Manipatruni, Portland, OR (US); Dmitri Nikonov, Beaverton, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 754 days.

(21) Appl. No.: 16/193,599

(22) Filed: Nov. 16, 2018

(65) Prior Publication Data

US 2020/0161535 A1 May 21, 2020

(51) Int. Cl.
| | |
|---|---|
| *H01L 43/02* | (2006.01) |
| *H01L 27/22* | (2006.01) |
| *G11C 11/16* | (2006.01) |
| *H01L 43/10* | (2006.01) |
| *H01F 10/32* | (2006.01) |

(52) U.S. Cl.
CPC ............ *H01L 43/02* (2013.01); *G11C 11/161* (2013.01); *H01F 10/329* (2013.01); *H01F 10/3254* (2013.01); *H01F 10/3286* (2013.01); *H01L 27/228* (2013.01); *H01L 43/10* (2013.01); *H01F 10/3268* (2013.01)

(58) Field of Classification Search
CPC ....... H01L 43/02; H01L 27/228; H01L 43/10; G11C 11/161; H01F 10/3254; H01F 10/3286; H01F 10/329

USPC ............................................. 257/421; 438/48
See application file for complete search history.

(56) References Cited

U.S. PATENT DOCUMENTS

| | | |
|---|---|---|
| 10,447,277 B1 | 10/2019 | Kazemi |
| 2005/0152075 A1 | 7/2005 | Miyazawa et al. |
| 2014/0254256 A1 | 9/2014 | Choi |
| 2017/0098760 A1 | 4/2017 | Lin et al. |
| 2018/0129043 A1 | 5/2018 | Kim et al. |
| 2018/0166197 A1* | 6/2018 | Wang et al. .......... H01F 10/329 |
| 2018/0240896 A1 | 8/2018 | Nikonov et al. |
| 2019/0325931 A1 | 10/2019 | Victora et al. |
| 2019/0386120 A1 | 12/2019 | Lin et al. |
| 2019/0386202 A1 | 12/2019 | Gosavi et al. |
| 2019/0386208 A1 | 12/2019 | Lin et al. |

(Continued)

OTHER PUBLICATIONS

Qi, J. et al., "Giant and Tunable Valley Degeneracy Splitting in MoTe2", DOI: 10.1103/PhysRevB.92.121403, published Sep. 8, 2015, 5 pages.

(Continued)

*Primary Examiner* — Thinh T Nguyen
(74) *Attorney, Agent, or Firm* — Essential Patents Group, LLP

(57) ABSTRACT

A memory apparatus is provided which comprises: a stack comprising a magnetic insulating material and a transition metal dichalcogenide (TMD), wherein the magnetic insulating material has a first magnetization. The stack behaves as a free magnet. The apparatus includes a fixed magnet with a second magnetization. An interconnect is further provided which comprises a spin orbit material, wherein the interconnect is adjacent to the stack.

13 Claims, 10 Drawing Sheets

(56) References Cited

U.S. PATENT DOCUMENTS

| | | |
|---|---|---|
| 2019/0386662 A1 | 12/2019 | Lin et al. |
| 2020/0161535 A1 | 5/2020 | Lin et al. |
| 2020/0273864 A1 | 8/2020 | Manipatruni et al. |
| 2020/0273866 A1 | 8/2020 | Manipatruni et al. |
| 2020/0273867 A1 | 8/2020 | Manipatruni et al. |
| 2020/0303343 A1 | 9/2020 | Manipatruni et al. |
| 2020/0303344 A1 | 9/2020 | Manipatruni et al. |
| 2020/0321344 A1 | 10/2020 | Ramamoorthy et al. |
| 2020/0321472 A1 | 10/2020 | Ramamoorthy et al. |
| 2020/0321473 A1 | 10/2020 | Ramamoorthy et al. |
| 2020/0321474 A1 | 10/2020 | Ramamoorthy et al. |
| 2020/0402560 A1 | 12/2020 | Thirumala et al. |
| 2021/0202507 A1 | 7/2021 | Thareja et al. |
| 2021/0202510 A1 | 7/2021 | Thareja et al. |
| 2021/0202689 A1 | 7/2021 | Thareja et al. |
| 2021/0202690 A1 | 7/2021 | Thareja et al. |
| 2021/0203324 A1 | 7/2021 | Manipatruni et al. |
| 2021/0203325 A1 | 7/2021 | Manipatruni et al. |
| 2021/0203326 A1 | 7/2021 | Manipatruni et al. |
| 2021/0226636 A1 | 7/2021 | Manipatruni et al. |

OTHER PUBLICATIONS

Zhu, Z. et al., "Giant Spin-Orbit-Induced Spin Splitting in Two-Dimensional Transition-Metal Dichalcogenide Semiconductors", DOI: 10.1103/PhysRevB.84.153402, published Oct. 14, 2011, 5 pages.

* cited by examiner

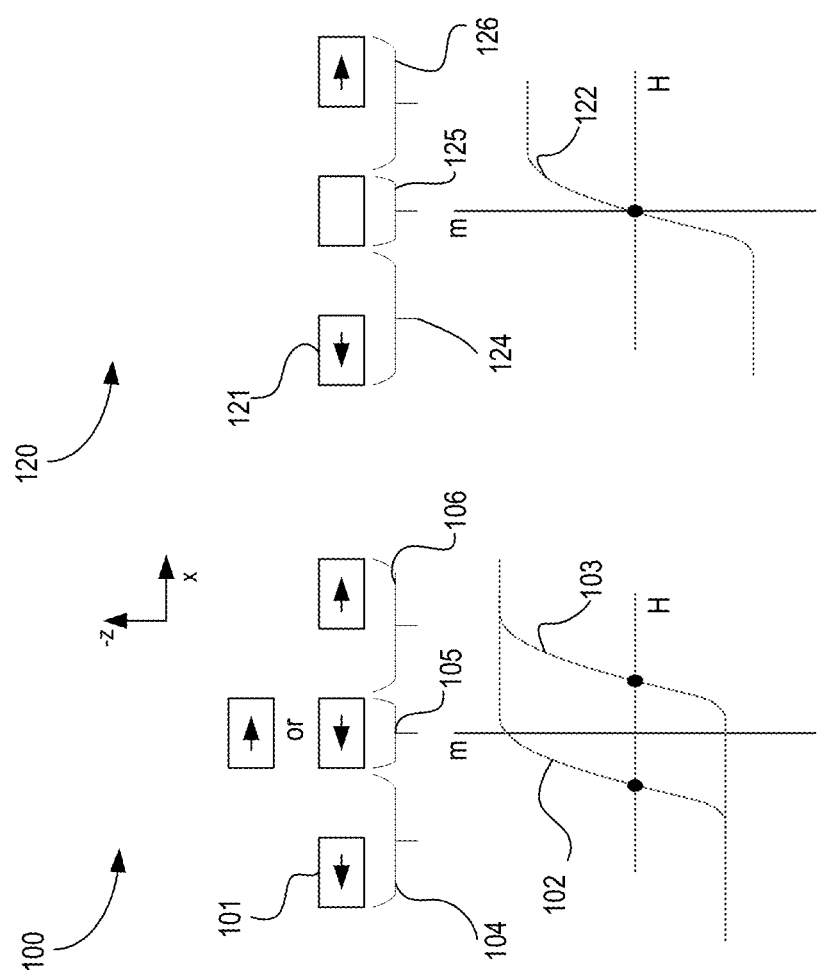

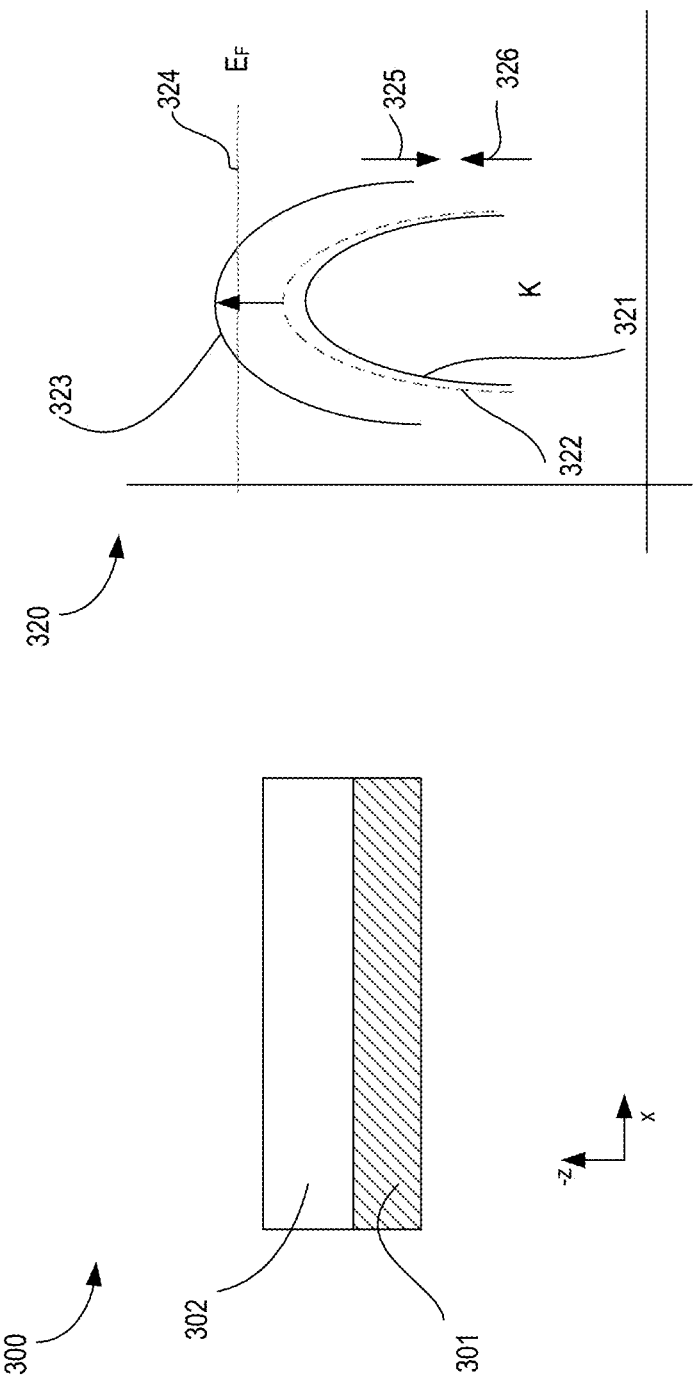

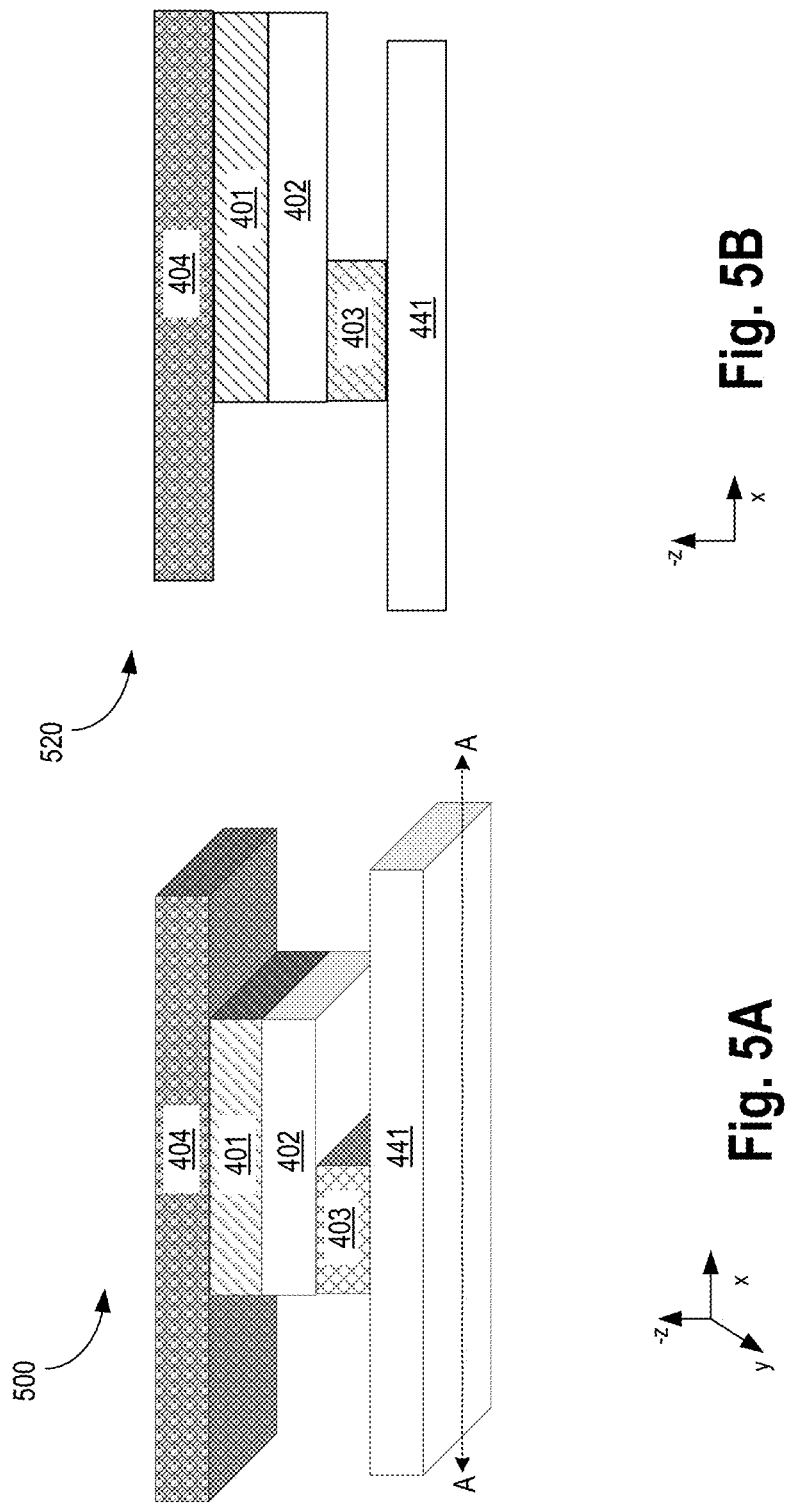

TRANSITION METAL DICHALCOGENIDE BASED SPIN ORBIT TORQUE MEMORY DEVICE WITH MAGNETIC INSULATOR

BACKGROUND

Perpendicular spin-orbit torque (pSOT) device is a promising replacement of an embedded static random access memory (e-SRAM). A pSOT device comprises a perpendicular magnetic tunneling junction (p-MTJ) stack on a spin orbit coupling (SOC) material.

However, fabricating a high quality p-MTJ stack on an SOC electrode is challenging. For example, forming a stable synthetic anti-ferromagnet (SAF) and a high tunnel magnetoresistance (TMR) is a challenge for pSOT based devices.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1A illustrates a magnetization response to applied magnetic field for a ferromagnet.

FIG. 1B illustrates a magnetization response to applied magnetic field for a paramagnet.

FIG. 3A illustrates a cross-sectional view of a stack comprising a magnetic insulator and a TMD, in accordance with some embodiments.

FIG. 3B illustrates a valance band for intrinsic TMD and the stack comprising a magnetic insulator and a TMD, in accordance with some embodiments.

FIGS. 5A-B illustrate a 3D view and a corresponding cross-sectional view, respectively, of a TMD based spin orbit coupling memory device, in accordance with some other embodiments.

DETAILED DESCRIPTION

Figure 2B:
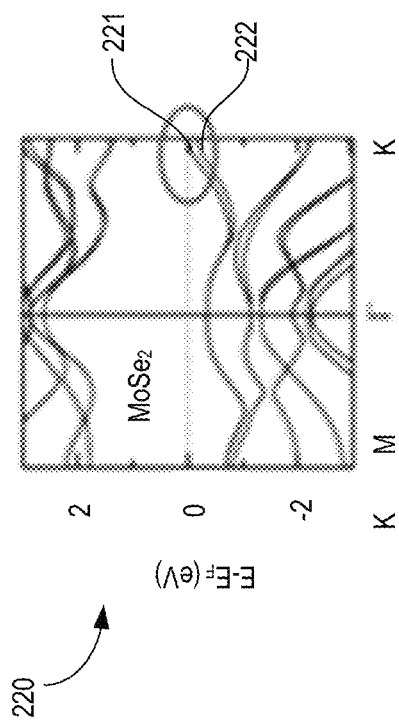
FIGS. 2A-D illustrate plots showing band diagrams of various transition metal dichalcogenides (TMDs).
Figure 2D:
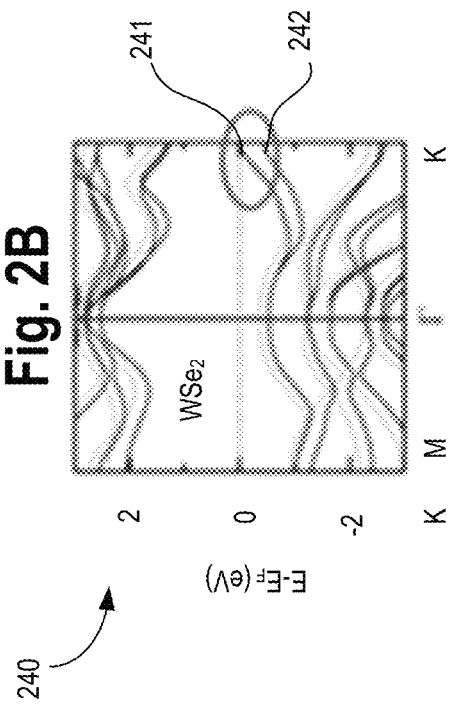
Figure 2A:
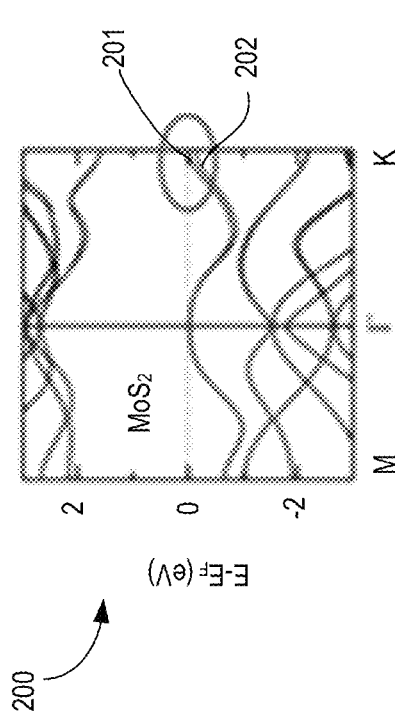
Figure 2C:
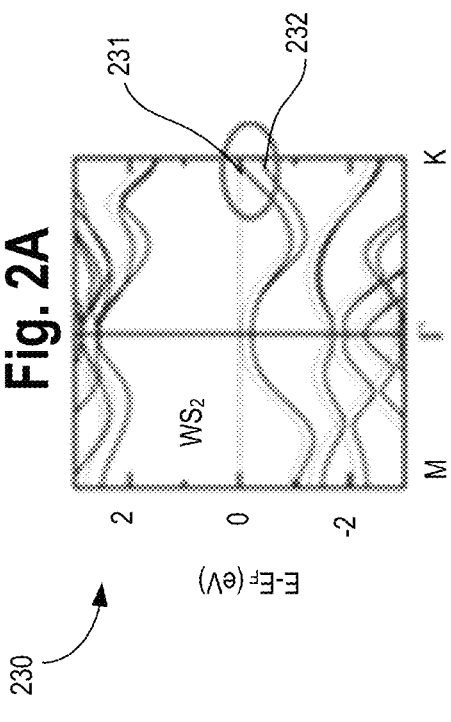

Some embodiments describe a memory device that uses a stack of transition metal dichalcogenide (TMD) and a magnetic insulator (MI) which together behave as a free magnet, wherein the stack is adjacent to a fixed magnet which in turn is adjacent to an interconnect comprising metal. In various embodiments, the stack of TMD and MI is adjacent to an interconnect comprising a spin orbit coupling material. In some embodiments, the stack of TMD and MI form a bi-layer which is spin filter with perpendicular magnetic anisotropy (PMA). In some embodiments, the bi-layer has in-plane magnetic anisotropy.

There are many technical effects of the various embodiments. For example, since the stack of TMD and MI is a spin filter with PMA (or in-plane magnetic anisotropy) and behaves as a free magnet, a basic component for magnetic memories. The spin polarization of TMD/MI bi-layer is controlled by the magnetization orientation of the magnetic insulator. The orientation of the magnetic insulator can be switched with spin orbit torque (or spin orbit coupling), which is demonstrated to be very efficient. The spin filter also removes the need to use a tunneling dielectric as used between the fixed and free magnets of an MTJ. As such, breakdown of tunneling dielectric (e.g., MgO) as experienced during readout is avoided. The spin filter of various embodiments also provides a high on/off ratio, which is similar to the on/off ratio of a TMD-based metal oxide semiconductor (MOS) device (e.g., approximately $10^5$). In some embodiments, the spin filter can also be used as an interconnect. The interconnect can be used for e-SRAM (embedded static random access memory) or e-DRAM (embedded dynamic access memory). Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "free" or "unfixed" here with reference to a magnet refers to a magnet whose magnetization direction can change along its easy axis upon application of an external field or force (e.g., Oersted field, spin torque, etc.). Conversely, the term "fixed" or "pinned" here with reference to a magnet refers to a magnet whose magnetization direction is pinned or fixed along an axis and which may not change due to application of an external field (e.g., electrical field, Oersted field, spin torque).

Here, perpendicularly magnetized magnet (or perpendicular magnet, or magnet with perpendicular magnetic anisotropy (PMA)) refers to a magnet having a magnetization which is substantially perpendicular to a plane of the magnet or a device. For example, a magnet with a magnetization which is in a z-direction in a range of 90 (or 270) degrees+/− 20 degrees relative to an x-y plane of a device.

Here, an in-plane magnet refers to a magnet that has magnetization in a direction substantially along the plane of the magnet. For example, a magnet with a magnetization which is in an x or y direction and is in a range of 0 (or 180 degrees)+/−20 degrees relative to an x-y plane of a device.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single finFET.

For the purposes of present disclosure, the terns "spin" and "magnetic moment" are used equivalently. More rigorously, the direction of the spin is opposite to that of the magnetic moment, and the charge of the particle is negative (such as in the case of electron).

It is pointed out that those elements of the figures having the same reference numbers (or names) as the elements of any other figure can operate or function in any manner similar to that described, but are not limited to such.

FIG. 1A illustrates a magnetization hysteresis plot 100 for ferromagnet (FM) 101. The plot shows magnetization response to an applied magnetic field for ferromagnet 101. The x-axis of plot 100 is magnetic field 'H' while the y-axis is magnetization 'm'. For FM 101, the relationship between 'H' and 'm' is not linear and results in a hysteresis loop as shown by curves 102 and 103. The maximum and minimum magnetic field regions of the hysteresis loop correspond to saturated magnetization configurations 104 and 106, respectively. In saturated magnetization configurations 104 and 106, FM 101 has stable magnetization. In the zero magnetic field region 105 of the hysteresis loop, FM 101 does not have a definite value of magnetization, but rather depends on the history of applied magnetic fields. For example, the magnetization of FM 101 in configuration 105 can be either in the +x direction or the −x direction for an in-plane FM. As such, changing or switching the state of FM 101 from one magnetization direction (e.g., configuration 104) to another magnetization direction (e.g., configuration 106) is time consuming resulting in slower nano-magnets response time. It is associated with the intrinsic energy of switching proportional to the area in the graph contained between curves 102 and 103.

In some embodiments, FM 101 is formed of CFGG (i.e., Cobalt (Co), Iron (Fe), Germanium (Ge), or Gallium (Ga) or a combination of them). In some embodiments, FM 101 comprises one or more of Co, Fe, Ni alloys and multilayer hetero-structures, various oxide ferromagnets, garnets, or Heusler alloys. Heusler alloys are ferromagnetic metal alloys based on a Heusler phase. Heusler phases are intermetallic with certain composition and face-centered cubic crystal structure. The ferromagnetic property of the Heusler alloys are a result of a double-exchange mechanism between neighboring magnetic ions. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu.

FIG. 1B illustrates magnetization plot 120 for paramagnet 121. Plot 120 shows the magnetization response to an applied magnetic field for paramagnet 121. The x-axis of plot 120 is magnetic field 'H' while the y-axis is magnetization 'm'. A paramagnet, as opposed to a ferromagnet, exhibits magnetization when a magnetic field is applied to it. Paramagnets generally have magnetic permeability greater or equal to one and hence are attracted to magnetic fields. Compared to plot 100, the magnetic plot 120 of FIG. 1B does not exhibit hysteresis which allows for faster switching speeds and smaller switching energies between the two saturated magnetization configurations 124 and 126 of curve 122. In the middle region 125, paramagnet 121 does not have any magnetization because there is no applied magnetic field (e.g., H=0). The intrinsic energy associated with switching is absent in this case.

In some embodiments, paramagnet 121 comprises a material which includes one or more of: Platinum (Pt), Palladium (Pd), Tungsten (W), Cerium (Ce), Aluminum (Al), Lithium (Li), Magnesium (Mg), Sodium (Na), $Cr_2O_3$ (chromium oxide), CoO (cobalt oxide), Dysprosium (Dy), $Dy_2O$ (dysprosium oxide), Erbium (Er), $Er_2O_3$ (Erbium oxide), Europium (Eu), $Eu_2O_3$ (Europium oxide), Gadolinium (Gd), Gadolinium oxide ($Gd_2O_3$), FeO and $Fe_2O_3$ (Iron oxide), Neodymium (Nd), $Nd_2O_3$ (Neodymium oxide), $KO_2$ (potassium superoxide), praseodymium (Pr), Samarium (Sm), $Sm_2O_3$ (samarium oxide), Terbium (Tb), $Tb_2O_3$ (Terbium oxide), Thulium (Tm), $Tm_2O_3$ (Thulium oxide), or $V_2O_3$ (Vanadium oxide). In some embodiments, paramagnet 121 comprises dopants which include one or more of: Ce, Cr, Mn, Nb, Mo, Tc, Re, Nd, Gd, Tb, Dy, Ho, Er, Tm, or Yb. In various embodiments, the magnet can be either a FM or a paramagnet.

FIGS. 2A-D illustrate plots 200, 220, 230, and 240, respectively, showing band diagrams of various transition metal dichalcogenides (TMDs). In TMDs such as $MoS_2$, $MoSe_2$, $WS_2$, and $WSe_2$, the strong spin-orbit interaction originating from the transition metal ion's d orbitals introduces a spin split in the valence bands. The difference is the degree of spit depends on the material for TMD. For plot 200, the spin split for $MoS_2$ is shown by spin-up 201 and spin-down 202. For plot 220, the spin split for $MoSe_2$ is shown by spin-up 221 and spin-down 222. For plot 230, the spin split for $WS_2$ is shown by spin-up 231 and spin-down 232. For plot 240, the spin split for $WSe_2$ is shown by spin-up 241 and spin-down 242. It should be noted that the spin-up and spin-down directions are labeled for explanation purposes, and that their labels can be reversed. For example, 221 illustrates spin-down while 222 illustrates spin up.

FIG. 3A illustrates a cross-sectional view 300 of a stack comprising a magnetic insulator MI 301 and a TMD 302, in accordance with some embodiments. In some embodiments, MI 301 comprises one or more of: EuS (europium sulfide), EuO (europium oxide), YIG (Yttrium iron garnet such as $Y_3Fe_5O_{12}$), TmIG (thulium iron garnet such as $Tm_3Fe_5O_{12}$), or GaMnAs (Gallium manganese arsenide). In some embodiments, TMD 302 comprises one or more of: $MoS_2$ (Molybdenum disulfide), $MoSe_2$ (Molybdenum diselenide) $WS_2$ (Tungsten disulfide), $WSe_2$ (Tungsten diselenide), $PtS_2$ (Platinum disulfide), $PtSe_2$ (Platinum diselenide), $WTe_2$ (Tungsten Ditelluride), $MoTe_2$ (Molybdenum Ditelluride), or graphene.

FIG. 3B illustrates plot 320 showing valance band for intrinsic TMD and the stack comprising an MI and a TMD, in accordance with some embodiments. Here, three valance bands are shown where valance band 321 is one of spin-split sub-band, valance band 322 is the other spin-split sub-band for an intrinsic TMD, and valance band 323 is the lift of valance band 322 for the stack comprising MI 301 and TMD 302. The valance band 323 rises above valance bands 322 and 321, and over the Fermi energy level $E_F$ 324 resulting in a clear or pronounced split of spin-down 325 and spin-up 326 orientations. In one example, valley-splitting of over 300 meV is seen for $MoTe_2$ and EuO stacked materials. This clear split of spin-down 325 and spin-up 326 orientations is largely because of the MI layer 301 when combined with TMD 302 to form a stack. This stack can be used as a spin filter. As such, in a TMD/MI stack, if spin splitting is large enough, it allows transport charge current with one specific spin polarization. For example, if valance band with spin "up" is lifted in a TMD/MI stack, charge current with spin "up" can flow through, but charge current with spin "down" cannot flow through.

Figure 4A:
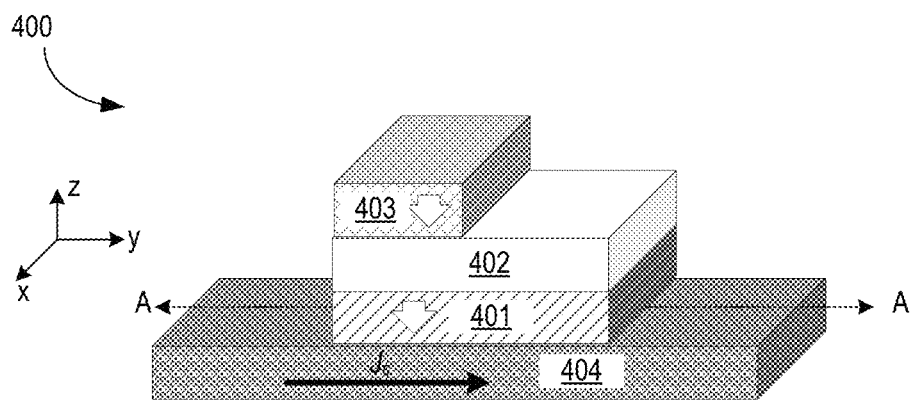
FIGS. 4A-B illustrate a three-dimensional (3D) view and a corresponding cross-sectional view, respectively, of a TMD based spin orbit coupling memory device, in accordance with some embodiments.
Figure 4B:
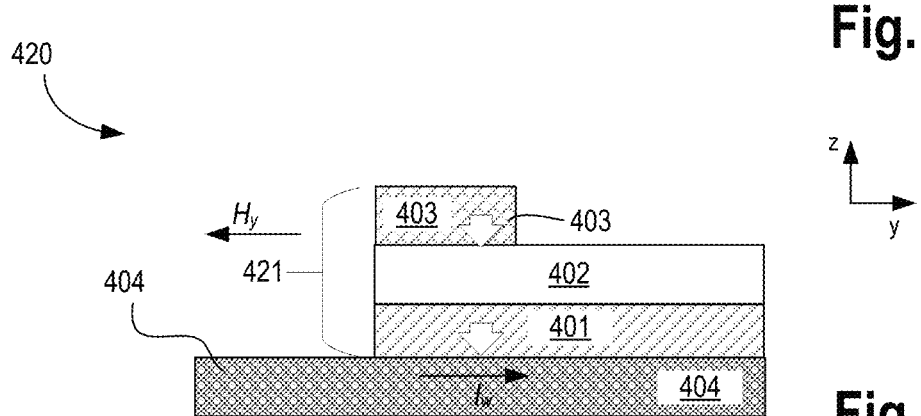

FIGS. 4A-B illustrate a three-dimensional (3D) view 400 and a corresponding cross-sectional view 420, respectively, of a TMD based spin orbit coupling memory device, in accordance with some embodiments. In some embodiments, the device comprises a magnetic insulator (MI) 401, TMD 402, fixed magnet 403, and spin orbit coupling interconnect 404. The device forms a three-terminal device, where the first terminal is coupled to fixed magnet 403 (directly or indirectly through an electrode and/or a synthetic antiferromagnetic material (SAF)) while the other two terminals are coupled to the SOC interconnect 404 (e.g., on either side of the length of the SOC interconnect along the y-axis).

In some embodiments, MI 401 comprises one or more of: EuS (europium sulfide), EuO (europium oxide), YIG (Yttrium iron garnet such as $Y_3Fe_5O_{12}$), TmIG (thulium iron garnet such as $Tm_3Fe_5O_{12}$), or GaMnAs (Gallium manganese arsenide). In some embodiments, TMD 402 comprises one or more of: MoS$_2$ (Molybdenum disulfide), MoSe$_2$ (Molybdenum diselenide) WS$_2$ (Tungsten disulfide), WSe$_2$ (Tungsten diselenide), PtS$_2$ (Platinum disulfide), PtSe$_2$ (Platinum diselenide), WTe$_2$ (Tungsten Ditelluride), MoTe$_2$ (Molybdenum Ditelluride), or graphene.

In some embodiments, fixed magnet 403 has saturated magnetization M$_s$ and effective anisotropy field H$_k$. Saturated magnetization M$_s$ is generally the state reached when an increase in applied external magnetic field H cannot increase the magnetization of the material. Anisotropy H$_k$ generally refers material properties that are highly directionally dependent.

In some embodiments, fixed magnet 403 is a ferromagnet (FM) which includes materials such as: of CFGG (i.e., Cobalt (Co), Iron (Fe), Germanium (Ge), or Gallium (Ga) or a combination of them). In some embodiments, FM 403 comprises one or more of Co, Fe, Ni alloys and multilayer hetero-structures, various oxide ferromagnets, garnets, or Heusler alloys. For example, CoFeB, FeB, CoFe, LaSrMoO$_3$(LSMO), Co/Pt, CoFeGd, and ferromagnetic semi-metal such as Weyl, and Heusler alloy such as Cu$_2$MnAl, Cu$_2$MnIn, Cu$_2$MnSn can be used for FM 403. Heusler alloys are ferromagnetic metal alloys based on a Heusler phase. Heusler phases are intermetallic with certain composition and face-centered cubic crystal structure. The ferromagnetic property of the Heusler alloys are a result of a double-exchange mechanism between neighboring magnetic ions. In some embodiments, the Heusler alloy includes one of: Cu$_2$MnAl, Cu$_2$MnIn, Cu$_2$MnSn, Ni$_2$MnAl, Ni$_2$MnIn, Ni$_2$MnSn, Ni$_2$MnSb, Ni$_2$MnGa Co$_2$MnAl, Co$_2$MnSi, Co$_2$MnGa, Co$_2$MnGe, Pd$_2$MnAl, Pd$_2$MnIn, Pd$_2$MnSn, Pd$_2$MnSb, Co$_2$FeSi, Co$_2$FeAl, Fe$_2$VAl, Mn$_2$VGa, Co$_2$FeGe, MnGa, or MnGaRu.

In some embodiments, fixed magnet 403 is a paramagnet. Paramagnets are non-ferromagnetic elements with strong paramagnetism which have high number of unpaired spins but are not room temperature ferromagnets. A paramagnet, as opposed to a ferromagnet, exhibits magnetization when a magnetic field is applied to it. In some embodiments, the paramagnet comprises a material which includes one or more of: Platinum (Pt), Palladium (Pd), Tungsten (W), Cerium (Ce), Aluminum (Al), Lithium (Li), Magnesium (Mg), Sodium (Na), Cr$_2$O$_3$ (chromium oxide), CoO (cobalt oxide), Dysprosium (Dy), Dy$_2$O (dysprosium oxide), Erbium (Er), Er$_2$O$_3$ (Erbium oxide), Europium (Eu), Eu$_2$O$_3$ (Europium oxide), Gadolinium (Gd), Gadolinium oxide (Gd$_2$O$_3$), FeO and Fe$_2$O$_3$ (Iron oxide), Neodymium (Nd), Nd$_2$O$_3$ (Neodymium oxide), KO$_2$ (potassium superoxide), praseodymium (Pr), Samarium (Sm), Sm$_2$O$_3$ (samarium oxide), Terbium (Tb), Tb$_2$O$_3$ (Terbium oxide), Thulium (Tm), Tm$_2$O$_3$ (Thulium oxide), or V$_2$O$_3$ (Vanadium oxide). In some embodiments, the paramagnet comprises dopants which include one or more of: Ce, Cr, Mn, Nb, Mo, Tc, Re, Nd, Gd, Tb, Dy, Ho, Er, Tm, or Yb.

In some embodiments, fixed magnet 403 is an insulating (insulative) or semi-insulating magnet, which comprises a material that includes one or more of: Co, Fe, No, or O. In some embodiments, the insulating or semi-insulating magnet comprises a material which includes one or more of: Co$_2$O$_3$, Fe$_2$O$_3$, Co$_2$FeO$_4$, or Ni$_2$FeO$_4$. In some embodiments, the insulating or semi-insulating magnet has Spinel crystal structure.

In some embodiments, fixed magnet 403 comprises at least two fixed magnets that are coupled by a coupling layer. In some embodiments, the coupling layer comprises one or more of: Ru, Os, Hs, Fe, or other similar transition metals from the platinum group of the periodic table. In some embodiments, the coupling layer(s) are removed so that the fixed magnets of the fixed magnet structure or stack are directly connected with one another forming a single magnet (or a composite magnet). A composite magnet may be a super lattice including a first material and a second material, wherein the first material includes one of: Co, Ni, Fe, or Heusler alloy, and wherein the second material includes one of: Pt, Pd, Ir, Ru, or Ni.

In some embodiments, fixed magnet 403 is an in-plane magnet and MI 401 is also an in-plane magnetic insulator. In some embodiments, fixed magnet 403 is an out-of-plane magnet and MI 401 is also an out-of-plane magnetic insulator. The thickness of a magnet 403 may determine its equilibrium magnetization direction. For example, when the thickness of the fixed magnet 403 is above a certain threshold (depending on the material of the magnet, e.g. approximately 1.5 nm for CoFe), then the ferromagnetic layer exhibits magnetization direction which is in-plane. Likewise, when the thickness of fixed magnet 403 is below a certain threshold (depending on the material of the magnet), then the magnet 403 exhibits magnetization direction which is perpendicular to the plane of the device.

Other factors may also determine the direction of magnetization. For example, factors such as surface anisotropy (depending on the adjacent layers or a multi-layer composition of the ferromagnetic layer) and/or crystalline anisotropy (depending on stress and the crystal lattice structure modification such as FCC (face centered cubic lattice), BCC (body centered cubic lattice), or L1$_0$-type of crystals, where L1$_0$ is a type of crystal class which exhibits perpendicular magnetization), can also determine the direction of magnetization.

L1$_0$ is a crystallographic derivative structure of an FCC (face centered cubic lattice) structure and has two of the faces occupied by one type of atom and the corner and the other face occupied with the second type of atom. When phases with the L1$_0$ structure are ferromagnetic, the magnetization vector usually is along the [0 0 1] axis of the crystal. Examples of materials with L1$_0$ symmetry include CoPt and FePt. Examples of materials with tetragonal crystal structure and magnetic moment are Heusler alloys such as CoFeAl, MnGe, MnGeGa, and MnGa.

In some embodiments, when fixed magnet 403 is a perpendicular magnet (e.g., magnet with out-of-plane magnetization relative to a plane of a device), fixed magnet 403 may comprise a stack of materials, wherein the materials for the stack are selected from a group consisting of: Co and Pt; Co and Pd; Co and Ni; MgO, CoFeB, Ta, CoFeB, and MgO; MgO, CoFeB, W, CoFeB, and MgO; MgO, CoFeB, V, CoFeB, and MgO; MgO, CoFeB, Mo, CoFeB, and MgO; Mn$_x$Ga$_y$; materials with L1$_0$ symmetry; and materials with tetragonal crystal structure. In some embodiments, perpendicular magnet 403 is a magnet with PMA (perpendicular magnetic anisotropy) formed of a single layer of one or more materials. In some embodiments, the single layer comprises of MnGa.

In some embodiments, the spin orbit coupling (SOC) material of interconnect 404 (or the write electrode) includes 3D materials such as one or more of β-Tantalum (β-Ta), Ta, β-Tungsten (β-W), W, Pt, Copper (Cu) doped with elements (dopants) such as Iridium, Bismuth and any of the elements of 3d, 4d, 5d and 4f, 5f periodic groups in the Periodic Table which may exhibit high spin orbit coupling. In some embodiments, the SOC interconnect comprises one or more of: Pt, Ta, W, WO$_x$, CuBi, BiO$_x$, Bi$_2$Se$_3$, Bi$_2$Sb$_3$, SrIrO$_3$, or a stack of LaAlO$_3$ (LAO) and SrTiO$_3$ (STO).

In some embodiments, the spin orbit material of interconnect 404 includes transitions into high conductivity non-magnetic metal(s) on either side of interconnect 404 to reduce the resistance of interconnect 404. The non-magnetic metal(s)/b include one or more of: Cu, Co, α-Ta, Al, Au, Ag, graphene, CuSi, or NiSi.

In some embodiments, the spin orbit material of interconnect 404 includes one or more of: graphene, $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$. In some embodiments, the spin orbit material of interconnect 404 includes one of a 2D material or a 3D material, wherein the 3D material is thinner than the 2D material. In some embodiments, the spin orbit material of interconnect 404 comprises a spin orbit material which includes materials that exhibit Rashba-Bychkov effect.

In some embodiments, the 2D materials include one or more of: Mo, S, W, Se, Graphene, $MoS_2$, $WSe_2$, $WS_2$, or $MoSe_2$. In some embodiments, the 2D materials include an absorbent which includes one or more of: Cu, Ag, Pt, Bi, Fr, or H absorbents. In some embodiments, the spin orbit material of interconnect 404 includes materials that exhibit Rashba-Bychkov effect. In some embodiments, the spin orbit material of interconnect 404 includes materials that exhibit Rashba-Bychkov effect comprises materials $ROCh_2$, where 'R' includes one or more of: La, Ce, Pr, Nd, Sr, Sc, Ga, Al, or In, and where "Ch" is a chalcogenide which includes one or more of: S, Se, or Te. In some embodiments, when the magnets and the spin filter have in-plane magnetizations, spin orbit material may comprise materials that exhibit Rashba-Edelstine effect. Such materials include one or more of: β-Tantalum (β-Ta), Ta, β-Tungsten (β-W), W, Platinum (Pt), Copper (Cu) doped with elements including on of Iridium, Bismuth or elements of 3d, 4d, 5d and 4f, 5f periodic groups, Ti, S, W, Mo, Se, B, Sb, Re, La, C, P, La, As, Sc, O, Bi, Ga, Al, Y, In, Ce, Pr, Nd, F, Ir, Mn, Pd, or Fe.

In some embodiments, the magnetic orientation of MI 401 is controlled by SOC interconnect 404 resulting in a "free" spin filter stack formed of layers MI 401 and TMD 402. As such, MI 401 and TMD 402 together behave as a free magnet or the switching component of the memory device. In this example, MI 401 has its easy axis along the plane (e.g., z plane) direction. For this type, an external field along the y-axis, Hy, or interconnect 404 with build-in exchange bias field is applied to break the symmetry and achieve bipolar switching. Assuming that the driving force for switching originates from the spin orbit torque or spin Hall effect in interconnect 404, the critical current density Jc is given by:

$$J_c = \frac{2e\alpha M_s t_F}{\hbar \theta_{SH}^{eff}} \left( H_k^{eff}, in + \frac{H_k^{eff}, out}{2} \right)$$

where α a is the Gilbert damping constant, e is the elementary charge, h is the Dirac contact, $\theta_{SH}^{eff}$ is the effective spin Hall angle, $M_s$ is the saturation magnetization, $t_F$ is the thickness of the MI 401 along the z-direction, $H_k^{eff}$, in is in-plane effective anisotropy field, and $H_k^{eff}$, out is the out-of-plane effective anisotropy field of the MI 401.

In this example, the applied current $I_w$ is converted into spin current $I_s$ by SOC interconnect 404 (also referred to as the write electrode). This spin current switches the direction of magnetization of the MI 401 and thus changes the resistance of three terminal device. However, to read out the state of device, a sensing mechanism is used to sense the resistance change in the stack comprising layers 401, 402, and 403. This stack is also referred to as the non-tunneling magnetic junction 421.

The non-tunneling magnetic junction 421 of various embodiments is a memory cell which is written by applying a charge current via SOC interconnect 404. The stack of layers 401 and 402 together behave like a fixed magnet (or a reference magnet). The direction of the magnetic writing in MI 401 is decided by the direction of the applied charge current. Positive currents (e.g., currents flowing in the +y direction) produce a spin injection current with transport direction (along the +z direction) and spins pointing to the +x direction. The injected spin current in turn produces spin torque to align the MI 401 (coupled to SOC interconnect 404) in the +z direction. Negative currents (e.g., currents flowing in the −y direction) produce a spin injection current with transport direction (along the +z direction) and spins pointing to the −x direction. The injected spin current in-turn produces spin torque to align the MI 401 (coupled to the SOC interconnect 404) in the −z direction. In some embodiments, in materials with the opposite sign of the SOC effect, the directions of spin polarization and thus of the MI 401 magnetization alignment are reversed compared to the above.

Figure 4C:
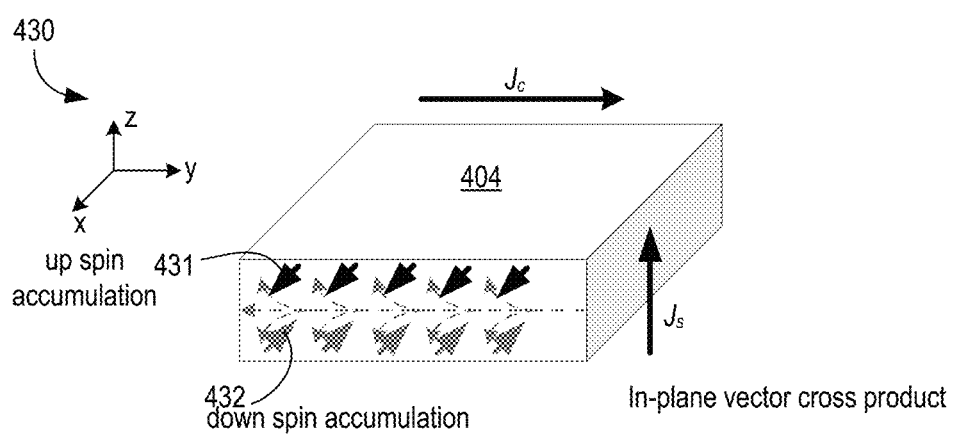
FIG. 4C illustrates a 3D view of a spin orbit coupling structure used for a TMD based spin orbit coupling memory device, in accordance with some embodiments.

FIG. 4C illustrates a 3D view 430 of a spin orbit coupling structure used for a TMD based spin orbit coupling memory device, in accordance with some embodiments.

In this example, positive charge current represented by $J_c$ produces spin-front (e.g., in the +x direction) polarized current 431 and spin-back (e.g., in the −x direction) polarized current 432. The injected spin current $J_s$ or $\vec{I_s}$ generated by a charge current $\vec{I_c}$ in the write electrode 404 is given by:

$$\vec{I}_s = P_{SHE}(w,t,\lambda_{sf},\theta_{SHE})(\vec{I}_c \times \hat{z}) \quad (1)$$

where, the vector of spin current $\vec{I}_s = \vec{I}_\uparrow - \vec{I}_\downarrow$ points in the direction of transferred magnetic moment and has the magnitude of the difference of currents with spin along and opposite to the spin polarization direction, $\hat{z}$ is the unit vector perpendicular to the interface, $P_{SHE}$ the spin Hall injection efficiency which is the ratio of magnitude of transverse spin current to lateral charge current, w is the width of the magnet, is t the thickness of the SOC Interconnect (or write electrode) 404, $\lambda_{sf}$ is the spin flip length in SOC interconnect 404, $\theta_{SHE}$ is the spin Hall angle for SOC interconnect SOC to free magnet layer interface. The injected spin angular momentum per unit time responsible for the spin torque is given by:

$$\vec{S} = \hbar \frac{\vec{I}_s}{2e} \quad (2)$$

The generated spin up and down currents 431/432 are equivalent to the spin polarized current per unit area (e.g., $\vec{J}_s$) given by:

$$\vec{J}_s = \theta_{SHE}(\vec{J}_c \times \hat{z}) \quad (3)$$

This spin to charge conversion is based on Tunnel Magneto Resistance (TMR) which is highly limited in the signal strength generated. The TMR based spin to charge conversion has low efficiency (e.g., less than one).

In some embodiments, switching layer 401 (e.g., MI 401) has easy axis in the film plane (e.g., y plane) and collinear with the current along the y-axis. The fixed magnet 403 also has magnetization along the y-plane. Material wise, the structures are same as those discussed above but with different magnetic orientation along the same plane. In some embodiments, the easy axis is parallel to the current flowing along the y axis. With the application of an external magnetic field, $H_z$, along the z-direction, or SOC interconnect 404 with build-in exchanging bias field along z-direction, bipolar switching is achieved in MI 401.

Figure 4D:
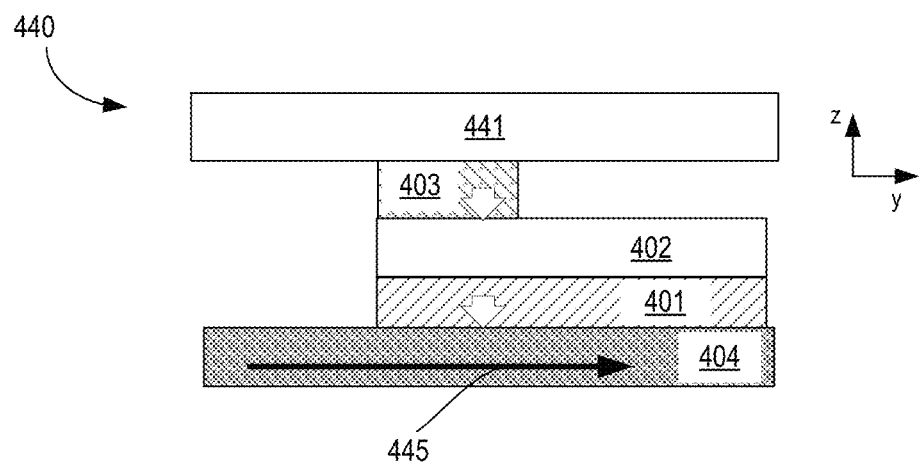
FIGS. 4D-E illustrate write and read mechanisms for the TMD based spin orbit coupling memory device, in accordance with some embodiments.
Figure 4E:
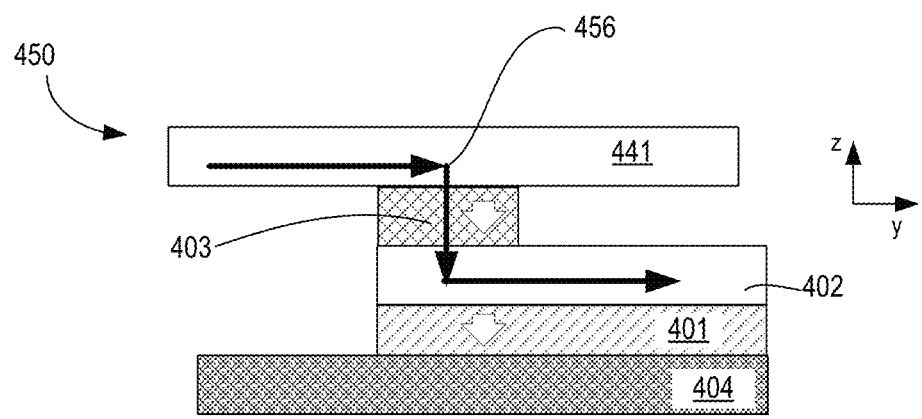

FIGS. 4D-E illustrate 3D views 440 and 450 for write and read mechanisms for the TMD based spin orbit coupling memory device, respectively, in accordance with some embodiments. Here, an interconnect 441 is formed adjacent to magnet 403. The interconnect can comprise any suitable conducting material such as Cu, Al, W, Ag, Au, Fe, Graphene, Co, and their alloys. The magnetization of MI 401 can be manipulated by SOC material through spin-orbit torque. If magnetic polarization of fixed magnet 403 and spin filter of layers 401/402 MI/TMD are aligned, the device is ON. If these two are opposite, the device is OFF.

During write operation, charge current $I_w$ 445 passes through SOC material of interconnect 404. During read operation, current 456 passes through interconnect 441, fixed magnet 403 and the spin filter stack comprising layers 401 and 402. Here, the spin filter stack allows for a non-tunneling junction without the need for tunneling dielectric material (e.g., MgO). Therefore, the breakdown of tunneling dielectric material during readout may not be a concern in the memory structure of the various embodiments. The non-tunneling junction of the various embodiments does not use high TMR as used in MTJ based devices. In some embodiments, the spin filter stack has high on/off ratio that is similar to the on/off ratio of TMD-based MOS devices. In some embodiments, the spin filter stack can also be used as an interconnect.

FIGS. 5A-B illustrate a 3D view 500 and a corresponding cross-sectional view 520, respectively, of a TMD based spin orbit coupling memory device, in accordance with some other embodiments. Compared to the devices of FIGS. 4A-B, here the devices are flipped along the z-axis such that the SOC interconnect 404 is at the top while the magnet 403 is at the top. Operation wise, and technical effect wise, the devices of FIGS. 5A-B operate same as the devices of FIGS. 4A-B.

Figure 6A:
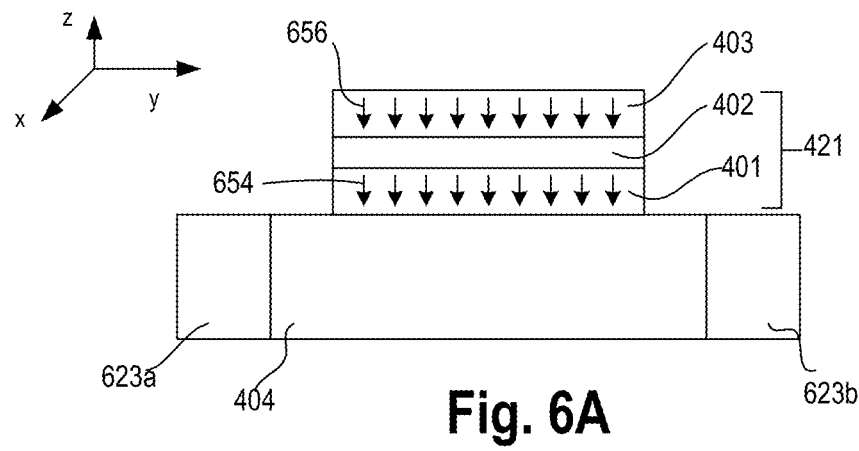
FIGS. 6A-C illustrate a mechanism for switching an out-of-plane TMD based spin orbit coupling memory device (e.g. device of FIG. 4A), in accordance with some embodiments.
Figure 6B:
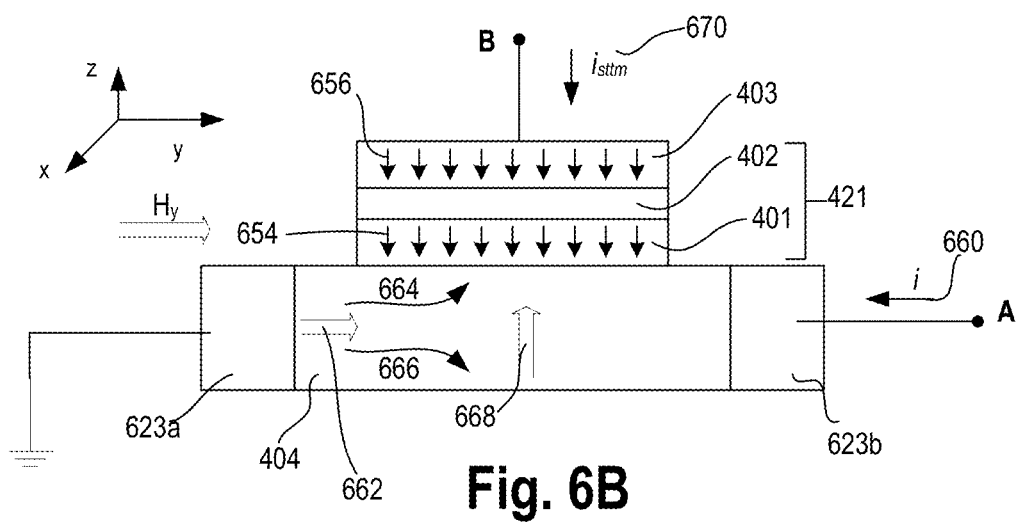
Figure 6C:
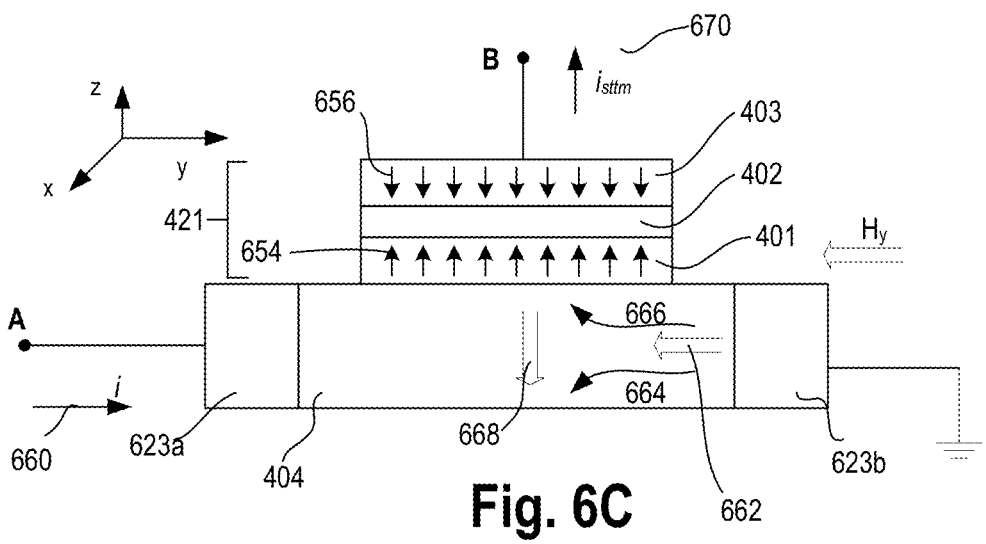

FIGS. 6A-C illustrate mechanisms for switching an out-of-plane TMD based spin orbit coupling memory device (e.g. device of FIG. 4A), in accordance with some embodiments.

FIG. 6A illustrates a non-tunneling magnetic memory device (e.g., the non-tunneling memory device of FIG. 4A) where the non-tunneling magnetic stack 421 is disposed on a spin orbit torque electrode 404, and where a magnetization 654 of the MI 401 (also referred to as storage layer 401) is in the same direction as a magnetization 656 of fixed magnet 403. Here, 623a/b are contacts coupled to the SOC interconnect 404. In some embodiments, the direction of magnetization 654 of the storage layer 401 and the direction of magnetization 656 of fixed magnet 403 are both in the negative z-direction as illustrated in FIG. 6A. When the magnetization 654 of the storage layer 401 is in the same direction as a magnetization 656 of the fixed magnet 403, the non-tunneling memory device of FIG. 4A is in a low resistance state. Conversely, when the magnetization 654 of the storage layer 401 is in the opposite direction as a magnetization 656 of fixed magnet 403, the non-tunneling memory device of FIG. 4A is in a high resistance state.

FIG. 6B illustrates a SOT memory device (e.g., the non-tunneling memory device of FIG. 4A) switched to a high resistance state. In an embodiment, a reversal in the direction of magnetization 654 of the storage layer 401 in FIG. 6B compared to the direction of magnetization 654 of the storage layer 401 is brought about by (a) inducing a spin hall current 668 in the spin orbit torque electrode 404 in the y-direction and (b) by applying a spin torque transfer current 670, $i_{STTM}$, (by applying a positive voltage at terminal B with respect to ground C), and/or (c) by applying an external magnetic field, $H_y$, in the y-direction.

In an embodiment, a charge current 660 is passed through the spin orbit torque electrode 404 in the negative y-direction (by applying a positive voltage at terminal A with respect to ground C). In response to the charge current 660, an electron current 662 flows in the positive y-direction. The electron current 660 includes electrons with two opposite spin orientations and experience a spin dependent scattering phenomenon in the spin orbit torque electrode 404.

The electron current 662 includes electrons with two opposing spin orientations, a type I electron 666, having a spin oriented in the negative x-direction and a type II electron 664 having a spin oriented in the positive x-direction. In some embodiments, electrons constituting the electron current 662 experience a spin dependent scattering phenomenon in the spin orbit torque electrode 404. The spin dependent scattering phenomenon is brought about by a spin-orbit interaction between the nucleus of the atoms in the spin orbit torque electrode 404 and the electrons in the electron current 662. The spin dependent scattering phenomenon causes type I electrons 666, whose spins are oriented in the negative x-direction, to be deflected upwards towards an uppermost portion of the spin orbit torque electrode 404 and type II electrons 664 whose spins are oriented in the positive x-direction to be deflected downwards towards a lowermost portion of the spin orbit torque electrode 404.

The separation between the type I electron spin angular moment 666 and the type II electron spin angular moment 664 induces a polarized spin diffusion current 668 in the spin orbit torque electrode 404. In some embodiments, the polarized spin diffusion current 568 is directed upwards toward the MI 401 of the non-tunneling memory device of FIG. 4A. The polarized spin diffusion current 668 induces a spin hall torque on the magnetization 654 of the MI 401. The spin Hall torque rotates the magnetization 654 to a temporary state pointing in the negative x-direction. In some embodiments, to complete the magnetization reversal process an additional torque is applied. The $i_{STTM}$ current 670 flowing through the non-tunneling magnetic memory device of FIG. 4A exerts an additional torque on the magnetization 654 of the storage layer 401. The combination of spin hall torque and spin transfer torque causes flipping of magnetization 654 in the storage layer 401 from the intermediate magnetization state (negative x-direction) to a positive z-direction illustrated in FIG. 6B. In some embodiments, an additional torque can be exerted on the storage layer 401 by applying an external magnetic field, $H_y$, in the y-direction, as illustrated in FIG. 6B, instead of applying an $i_{STTM}$ current 670.

FIG. 6C illustrates a SOT memory device switched to a low resistance state. In an embodiment, a reversal in the direction of magnetization 654 of the storage layer 401 in FIG. 6C compared to the direction of magnetization 654 of the storage layer 401 in FIG. 6B is brought about by (a) reversing the direction of the spin Hall current 668 in the spin orbit torque electrode 404 and (b) by reversing the direction of the $i_{STTM}$ current 670, and/or (c) by reversing the direction of the external magnetic field, $H_y$. While the embodiments of FIGS. 6A-C illustrate an example of device operation using perpendicular or out-of-plane magnetizations, the same concepts also apply when layers or structures 401 and 403 have in-plane magnetizations.

Figure 7:
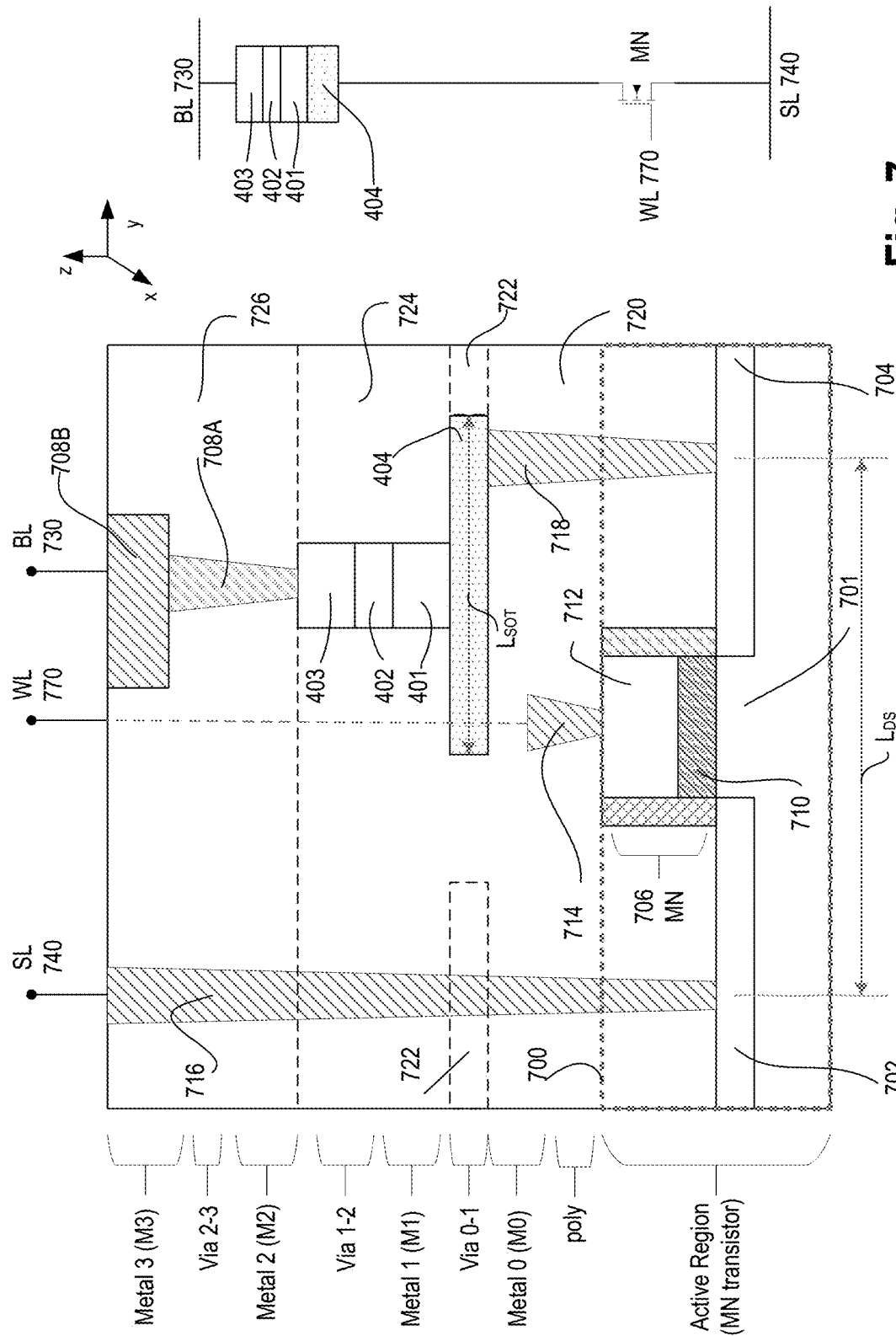
FIG. 7 illustrates a cross-sectional view of TMD based spin orbit coupling memory device coupled to a transistor and a bit line, according to some embodiments.

FIG. 7 illustrates a cross-sectional view of TMD based spin orbit coupling memory device coupled to a transistor and a bit line, according to some embodiments.

In an embodiment, the transistor 700 has a source region 702, a drain region 704 and a gate 706. The transistor 700 (e.g., n-type transistor MN) further includes a gate contact 714 disposed above and electrically coupled to the gate 706, a source contact 716 disposed above and electrically coupled to the source region 702, and a drain contact 718 disposed above and electrically coupled to the drain region 704 as is illustrated in FIG. 7A. In some embodiments, an SOT memory device such as an SOT non-tunneling memory device of FIG. 4A/5A is disposed above the transistor 700.

In some embodiments, the SOT memory device of FIG. 4A includes a spin orbit torque electrode, such as spin orbit torque electrode 404, a non-tunneling junction memory device such as device stack 421 disposed on the spin orbit torque electrode 404, and a conductive interconnect structure such as conductive interconnect structure 441 (e.g., structure 708A/B disposed on and coupled to the device stack 421. In some embodiments, the spin orbit torque electrode 404 is disposed on the drain contact 718 of the transistor 700.

In some embodiments, the SOT non-tunneling memory device of FIG. 4A (e.g., which includes non-tunneling memory stack 421) includes individual functional layers that are described in association with FIGS. 4A-C. In some embodiments, the spin orbit torque electrode 404 has a length, $L_{SOT}$ that is less than a distance of separation, $L_{DS}$ between the drain contact 718 and the source contact 716. In some embodiments, a portion of the spin orbit torque electrode 404 extends above the gate electrode 712 and the gate contact 714. In some embodiments, a portion of the spin orbit torque electrode 404 extends over the gate electrode 712. In some embodiments, the spin orbit torque electrode 404 is in a first y-z plane as illustrated in FIG. 4A.

In some embodiments, the gate contact 714 is directly below the spin orbit torque electrode 404. In some embodiments, a word-line (WL) contact is disposed onto the gate contact 714 on a second y-z plane behind (into the page) the first y-z plane of the spin orbit torque electrode 404. In some embodiments, the spin orbit torque electrode 404 that may not contact the word-line contact is disposed on the gate electrode 712.

In some embodiments, transistor 700 associated with substrate 701 is a metal-oxide-semiconductor field-effect transistor (MOSFET or simply MOS transistors), fabricated on the substrate 701. In various embodiments of the present disclosure, the transistor 700 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. In an embodiment, the transistor 700 is a tri-gate transistor.

In some embodiments, a voltage $V_{DS}$ is applied between the bit-line (BL) 730 and the source-line (SL) 740 and a word-line 770 is energized above a threshold voltage, $V_{TH}$ on the transistor 700. In some embodiments, an electron current (spin hall current) flows through the spin orbit torque electrode 404 and causes a spin diffusion current to flow toward the SOT non-tunneling memory device of FIG. 4A. The spin diffusion current exerts a torque on the magnetization of the MI 401.

In some embodiments, by applying a voltage $V_{DS}$ between bit-line 730 and source-line 740, current can flow through the SOT non-tunneling memory device of FIG. 4A. In some embodiments, a voltage $V_{DS}$ that is equal to or greater than the threshold voltage $V_{TS}$ is enough to generate spin polarized current through the non-tunneling stack 421. In some embodiments, the spin transfer torque current flowing through the non-tunneling 421 also imparts torque to the MI 401 adding to the torque from the spin diffusion current. In some embodiments, the combined effect of the spin transfer torque and the spin diffusion torque can switch the magnetization of the MI 401. In some embodiments, by reversing the polarity of the voltage $V_{DS}$, and applying a voltage that meets or exceeds a threshold voltage, the direction of magnetization of the MI 401 is switched back to a previous configuration.

In some embodiments, by applying a voltage between a bit-line 730 and source-line 740, and by applying a voltage above a threshold voltage, $V_{TH}$ on the word-line 770 of the transistor 700, SOT non-tunneling memory device of FIG. 4A can undergo magnetization switching without the need for an additional voltage source (e.g. a second transistor). In some embodiments, implementing an SOT non-tunneling memory device of FIG. 4A above a transistor can increase the number of SOT non-tunneling memory devices of FIG. 4A in a given area of a die by at least a factor of two.

In some embodiments, the underlying substrate 701 represents a surface used to manufacture integrated circuits. In some embodiments, the substrate 701 includes a suitable semiconductor material such as but not limited to, single crystal silicon, polycrystalline silicon and silicon on insulator (SOI). In another embodiment, the substrate 701 includes other semiconductor materials such as germanium, silicon germanium, or a suitable group III-V or group III-N compound. The substrate 701 may also include semiconductor materials, metals, dopants, and other materials commonly found in semiconductor substrates.

In some embodiments, the transistor 700 includes a gate stack formed of at least two layers, a gate dielectric layer 710 and a gate electrode layer 712. The gate dielectric layer 710 may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 710 to improve its quality when a high-k material is used.

The gate electrode layer 712 of the transistor 700 is formed on the gate dielectric layer 710 and may comprise of at least one P-type work-function metal or N-type work-function metal, depending on whether the transistor is to be a PMOS or an NMOS transistor. In some embodiments, the gate electrode layer 712 may comprise of a stack of two or more metal layers, where one or more metal layers are work-function metal layers and at least one metal layer is a conductive fill layer.

For a PMOS transistor, metals that may be used for the gate electrode layer 712 include, but are not limited to, ruthenium, palladium, platinum, cobalt, nickel, and conductive metal oxides, e.g., ruthenium oxide. A P-type metal layer will enable the formation of a PMOS gate electrode layer 712 with a work-function that is between about 4.9 eV and about 5.2 eV. For an NMOS transistor, metals that may be used for the gate electrode layer 712 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode layer 712 with a work-function that is between about 3.9 eV and about 4.2 eV.

In some embodiments, the gate electrode layer 712 may comprise a U-shaped structure that includes a bottom portion substantially parallel to the surface of the substrate and two sidewall portions that are substantially perpendicular to the top surface of the substrate. In another embodiment, at least one of the metal layers that form the gate electrode layer 712 may simply be a planar layer that is substantially parallel to the top surface of the substrate and does not include sidewall portions substantially perpendicular to the top surface of the substrate. In some embodiments of the present disclosure, the gate electrode layer 712 may comprise of a combination of U-shaped structures and planar, non-U-shaped structures. For example, the gate electrode layer 712 may comprise of one or more U-shaped metal layers formed atop one or more planar, non-U-shaped layers.

In some embodiments, a pair of gate dielectric layers 710 may be formed on opposing sides of the gate stack that bracket the gate stack. The gate dielectric layer 710 may be formed from a material such as silicon nitride, silicon oxide, silicon carbide, silicon nitride doped with carbon, and silicon oxynitride. Processes for forming sidewall spacers are well known in the art and generally include deposition and etching process operations. In some embodiments, a plurality of spacer pairs may be used, for instance, two pairs, three pairs, or four pairs of sidewall spacers may be formed on opposing sides of the gate stack.

In some embodiments, source region 702 and drain region 704 are formed within the substrate adjacent to the gate stack of the transistor 700. The source region 702 and drain region 704 are generally formed using either an implantation/diffusion process or an etching/deposition process. In the former process, dopants such as boron, aluminum, antimony, phosphorous, or arsenic may be ion-implanted into the substrate to form the source region 702 and drain region 704. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source region 702 and drain region 704. In some embodiments, the source region 702 and drain region 704 may be fabricated using a silicon alloy such as silicon germanium or silicon carbide. In some embodiments, the epitaxially deposited silicon alloy may be doped in-situ with dopants such as boron, arsenic, or phosphorous. In some embodiments, the source region 702 and drain region 704 may be formed using one or more alternate semiconductor materials such as germanium or a suitable group III-V compound. In some embodiments, one or more layers of metal and/or metal alloys may be used to form the source region 702 and drain region 704.

In some embodiments, the gate contact 714 and drain contact 718 of the transistor 700 are disposed in a first dielectric layer 720 disposed above the substrate 701. In some embodiments, the spin orbit torque electrode 404 is disposed in a second dielectric layer 722 disposed on the first dielectric layer 720. In some embodiments, a third dielectric layer 724 is disposed on the second dielectric layer 722. In some embodiments, a fourth dielectric layer 726 is disposed on the third dielectric layer 724. In some embodiments, a source contact 716 is partially disposed in the fourth dielectric layer 726, partially disposed in the third dielectric layer 724, partially disposed in the second dielectric layer 722 and partially disposed on the first dielectric layer 720. In some embodiments, the spin orbit torque electrode contact is disposed in the third dielectric layer 724 on the spin orbit torque electrode 404. In some embodiments, the conductive interconnect structure such as conductive interconnect structure 708A/B disposed in the fourth dielectric layer 726.

In the illustrated embodiment of FIG. 6A, the gate contact 714 is formed in poly region; drain contact 718 is formed in active, poly, and Metal 0 (M0); SOT or SHE electrode 404 is formed in Via 0-1 layer; MTJ 421 is formed in Metal 1 (M1) and Via 1-2; contract 708A is formed in Metal 2 (M2) and Via 2-3; and conductor 708B is formed in Metal 3 (M3).

In some embodiments, the non-tunneling magnetic junction stack 421 is formed in the metal 3 (M3) region. In some embodiments, the MI layer 403 couples to SOC electrode 404. In some embodiments, fixed magnet 403 communicatively couples to the bit-line (BL) via SOC electrode 404 through Via 3-4 (e.g., via connecting metal 4 region to metal 4 (M4)). In this example embodiments, the bit-line is formed on M4. In some embodiments, fixed magnet 403 directly couples to BL 730. In some embodiments, fixed magnet 403 indirectly couples to BL 730. For example, SAF layer(s) not shown may be formed over fixed magnet 403 and an electrode over the SAF layer(s) may be coupled to BL 730. Effectively, BL 730 is coupled to fixed magnet 403.

In some embodiments, an n-type transistor MN is formed in the frontend of the die while the SOC electrode 404 is located in the backend of the die. Here, the term "backend" generally refers to a section of a die which is opposite of a "frontend" and where an IC (integrated circuit) package couples to IC die bumps. For example, high level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example). In some embodiments, the SOC electrode 404 is located in the backend metal layers or via layers for example, in Via 3. In some embodiments, the electrical connectivity to the device is obtained in layers M0 and M4 or M1 and M5 or any set of two parallel interconnects. In some embodiments, the MTJ 421 is formed in metal 2 (M2) and metal 1 (M1) layer region and/or Via 1-2 region. In some embodiments, the SOC electrode 404 is formed in the metal 1 region.

While the embodiment of FIG. 7 is illustrated with reference to FIG. 4A memory device, the memory device of FIG. 5A can also be used and appropriate changes to the interconnects/vias can be made for proper connection.

Figure 8:
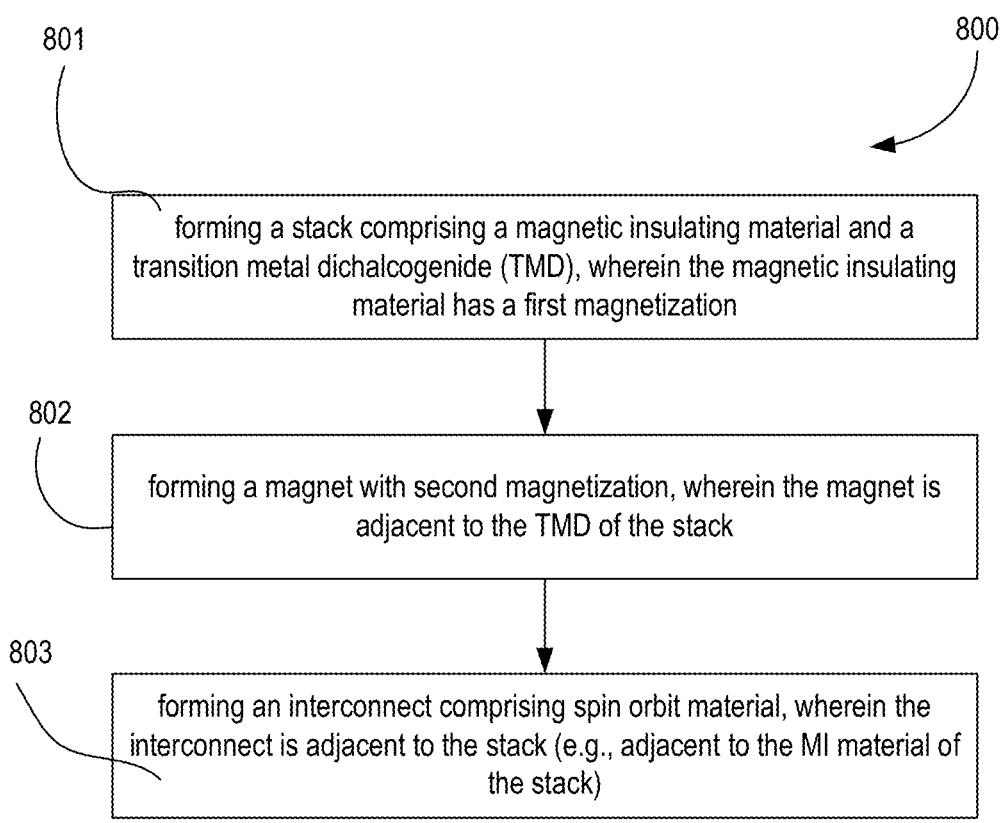
FIG. 8 illustrates a flowchart of a method for forming a TMD based spin orbit coupling memory device, according to some embodiments of the disclosure.

FIG. 8 illustrates a flowchart 800 of a method for forming a TMD based spin orbit coupling memory device, according to some embodiments of the disclosure. The various operations here can be organized in any order. Some blocks can be performed in parallel to other blocks.

At block 801, a spin filter is formed by fabricating a stack comprising MI 401 material and TMD 402, wherein MI 401 has a first magnetization (e.g., out-of-plane relative to a plane of a device). In some embodiments, MI 401 comprises one or more of: EuS, EuO, YIG, TmIG, and GaMnAs. In some embodiments, TMD 402 comprises one or more of: $MoS_2$, $MoSe_2$, $WS_2$, $WSe_2$, $PtS_2$, $PtSe_2$, $WTe_2$, and $MoTe_2$, and graphene.

At block 802, a fixed magnet 403 is formed with second magnetization, wherein fixed magnet 403 is adjacent to the spin filter. For example, fixed magnet 403 is coupled to TMD 402 of the spin filter. In some embodiments, fixed magnet 403 includes one or more of: Co, Ni, Fe, CoFeB, FeB, CoFe, $LaSrMoO_3$(LSMO), Co/Pt, CoFeGd, and ferromagnetic semi-metal such as Weyl, and Heusler alloy such as $Cu_2MnAl$, $Cu_2MnIn$, $Cu_2MnSn$. Here, the TMD 402 and MI 401 together forms a free magnet.

At block 803, SOC interconnect 404 is formed, wherein SOC interconnect 404 is adjacent to MI 401. In some embodiments, SOC interconnect 404 comprises one or more of: Pt, Ta, W, $WO_x$, CuBi, $BiO_x$, $LaAlO_3/SrTiO_3$, $Bi_2Se_3$, $Bi_2Sb_3$, $SrIrO_3$. As such, a magnetic device is formed using spin filter.

Figure 9:
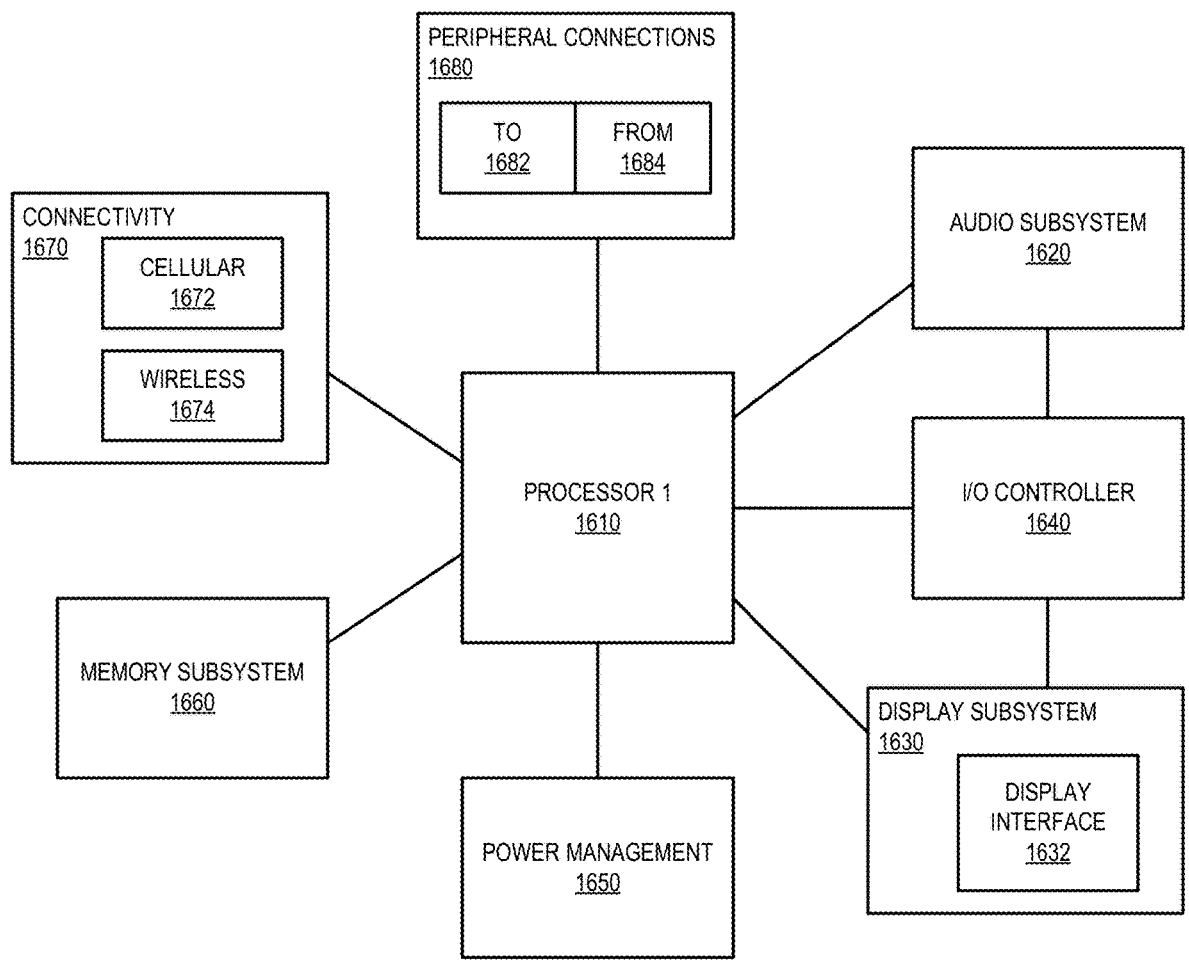
FIG. 9 illustrates a smart device or a computer system or a SoC (System-on-Chip) with TMD based spin orbit coupling memory device, according to some embodiments.

FIG. 9 illustrates a smart device or a computer system or a SoC (System-on-Chip) with one or more SOT non-tunneling memory devices such as those described in FIGS. 4-7, according to some embodiments. FIG. 9 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with one or more SOT non-tunneling memory devices such as those described in FIGS. 4-7, according to some embodiments discussed. Other blocks of the computing device 1600 may also include one or more SOT non-tunneling memory devices such as those described in FIGS. 4-7, according to some embodiments. The various embodiments of the present disclosure may also comprise a network interface within connectivity 1670 such as a wireless interface so that a system embodiment may be incorporated into a wireless device, for example, cell phone or personal digital assistant.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600 or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), Display-Port including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a stack comprising a magnetic insulative material and a transition metal dichalcogenide (TMD), wherein the magnetic insulative material has a first magnetization;
   a magnet with a second magnetization, wherein the magnet is adjacent to the TMD of the stack; and
   an interconnect comprising a spin orbit material, wherein the interconnect is adjacent to the stack.

2. The apparatus of claim 1, wherein the first magnetization and the second magnetization are perpendicular to a plane of a device; or wherein the first magnetization and the second magnetization are parallel to the plane of the device.

3. The apparatus of claim 1, wherein magnet comprises a material which includes one or more of: Co, Fe, Ni, or O.

4. The apparatus of claim 1, wherein the magnet is one of a paramagnet or ferromagnet.

5. The apparatus of claim 1, wherein the magnet comprises a material which includes one or more of: Pt, Pd, W, Ce, Al, Li, Mg, Na, Cr, O, Co, Dy, Er, Eu, Gd, Fe, Nd, K, Pr, Sm, Tb, Tm, or V.

6. The apparatus of claim 1, wherein the magnet comprises one or a combination of materials which includes one or more of: a Heusler alloy, Co, Fe, Ni, Gd, B, Ge, Ga, permalloy, or Yttrium Iron Garnet (YIG), and wherein the Heusler alloy is a material which includes one or more of: Cu, Mn, Al, In, Sn, Ni, Sb, Ga, Co, Fe, Si, Pd, Sb, Si, V, or Ru.

7. The apparatus of claim 1, wherein the magnetic insulative material comprises one or more of: Eu, S, 0, Y, Fe, Tm, Ga, Mn, or As.

8. The apparatus of claim 1, wherein the TMD comprises one or more of: Mo, S, Se, W, Pt, Te, or graphene.

9. The apparatus of claim 1, wherein the spin orbit material includes one or more of: β-Tantalum (β-Ta), Ta, β-Tungsten (β-W), W, Platinum (Pt), Copper (Cu) doped with elements including on of Iridium, Bismuth or elements of 3d, 4d, 5d and 4f, 5f periodic groups, Ti, S, W, Mo, Se, B, Sb, Re, La, C, P, La, As, Sc, O, Bi, Ga, Al, Y, In, Ce, Pr, Nd, F, Ir, Mn, Pd, or Fe.

10. The apparatus of claim 1, wherein:
the spin orbit material includes one of: a 2D material, a 3D material, an antiferromagnetic (AFM) material, or an AFM material doped with a dopant;
the 3D material is thinner than the 2D material; or
the dopant includes one of: Co, Fe, Ni, Mn, Ga, Fe, or Bct-Ru.

11. A system comprising:
a memory;
a processor coupled to the memory, the processor including a spin filter device comprising
the apparatus of claim 1; and
a wireless interface to allow the processor to communicate with another device.

12. The system of claim 11, wherein:
the magnetic insulative material comprises one or more of: Eu, S, O, Y, Fe, Tm, Ga, Mn, or As; and
the TMD comprises one or more of: Mo, S, Se, W, Pt, Te, or graphene;
the magnet comprises a material which includes one or more of: Pt, Pd, W, Ce, Al, Li, Mg, Na, Cr, O, Co, Dy, Er, Eu, Gd, Fe, Nd, K, Pr, Sm, Tb, Tm, or V; or
the magnet comprises one or a combination of materials which includes one or more of: a Heusler alloy, Co, Fe, Ni, Gd, B, Ge, Ga, permalloy, or Yttrium Iron Garnet (YIG).

13. The system of claim 11, wherein the spin orbit material includes one or more of: β-Tantalum (β-Ta), Ta, β-Tungsten (β-W), W, Platinum (Pt), Copper (Cu) doped with elements including on of Iridium, Bismuth or elements of 3d, 4d, 5d and 4f, 5f periodic groups, Ti, S, W, Mo, Se, B, Sb, Re, La, C, P, La, As, Sc, O, Bi, Ga, Al, Y, In, Ce, Pr, Nd, F, Ir, Mn, Pd, or Fe.

* * * * *